United States Patent [19]
Biehl et al.

[11] Patent Number: 4,633,180
[45] Date of Patent: Dec. 30, 1986

[54] CAVITY RESONATOR

[75] Inventors: Reinhard Biehl, Karlsruhe; Dieter Schmalbein, Marxzell-Burbach; Günther Laukien, Rheinstetten-Forchheim, all of Fed. Rep. of Germany

[73] Assignee: Bruker Analytische Messtechnik GmbH, Rheinstetten-Forchheim, Fed. Rep. of Germany

[21] Appl. No.: 567,960

[22] Filed: Jan. 4, 1984

[30] Foreign Application Priority Data

Jan. 12, 1983 [DE] Fed. Rep. of Germany ....... 3300767

[51] Int. Cl.$^4$ ............................................. G01R 33/08
[52] U.S. Cl. .................................. 324/316; 324/318; 333/219; 333/227
[58] Field of Search ................... 324/316, 58 R, 58 C, 324/318, 58.5 C; 333/219, 227, 228, 229, 230, 231, 232, 233, 234, 235; 332/29 M

[56] References Cited

U.S. PATENT DOCUMENTS

| | | | |
|---|---|---|---|
| 2,096,459 | 10/1937 | Kassner | 333/235 |
| 2,356,414 | 8/1944 | Linder | 333/227 |
| 2,622,199 | 12/1952 | Ramsay | 333/227 |
| 2,857,574 | 10/1952 | Anderson | 333/219 |
| 4,388,601 | 6/1983 | Sneed, Jr. et al. | 324/318 |
| 4,435,680 | 3/1984 | Froncisz | 324/316 |
| 4,446,429 | 5/1984 | Froncisz | 333/235 |

OTHER PUBLICATIONS

"Design of a Split Ring Resonator for ESR Spectroscopy between 1 and 4 GHz"—Momo, J. Phys. E.: Sci. Instrum., vol. 16, (1983), pp. 43–46.
"Dispersion Electron Spin Resonance with Loop-Gap Resonator"—Hyde, Rev. Sci. Instrum., vol. 53, (1982), No. 12, pp. 1934–1937.
"Improved Evaporation Geometry of Powdered Materials"—Singh, Rev. Sci. Instrum., vol. 53, (1982), No. 12, p. 1932.
"Cavity Stabilized Impatt Oscillator for ESR Spectroscopy"—Momo, J. Phys. E.: Sci. Instrum., vol. 14, No. 3, Mar., 1981.

*Primary Examiner*—Stephen A. Kreitman
*Assistant Examiner*—Scott M. Oldham

[57] ABSTRACT

A cavity resonator serves to generate magnetic dipole transitions in a sample, for instance for carrying out electron spin resonance measurements. The natural frequency of the cavity resonator (10) is influenced by a reduction in length of the E flux lines. To this end, conductive areas (20) are arranged at the points where the E flux lines are encountered. This results in an increase of the space factor, related to an unchanged specimen volume, and thus in an improvement of the measuring sensitivity.

11 Claims, 8 Drawing Figures

CAVITY RESONATOR

BACKGROUND OF THE INVENTION

The present invention starts out from a cavity resonator for generating magnetic dipole junctions in a test specimen, the test specimen being located within a resonator area exhibiting a high density of magnetic flux lines and the cavity resonator being excited by an oscillation mode with closed electric field lines.

In analytic measuring techniques, a number of methods have been known for investigating the properties of materials by exciting magnetic dipole junctions in test specimens of the said materials. The most widely used methods of this type are the nuclear magnetic resonance (NMR) and the electron spin resonance (ESR) methods.

For generating one of these resonance phenomena it is necessary that the test specimen to be investigated be simultaneously exposed to a radio frequency field and a constant magnetic field directed vertically thereto. The test specimen is introduced into a system capable of resonating and positioned at a point where magnetic flux lines (H) propagate at a high density or intensity.

FIELD OF THE INVENTION

There have been known from the literature resonant systems of the most different configurations, for use with different frequency ranges. As is generally known, such resonant systems may consist of a connection of individual discrete components, the most widely employed connection of this type being the series resonant circuit or the parallel resonant circuit comprising one capacitor and one coil each. In such arrangements it is possible to achieve a clear distribution of the capacitive and/or conductive components of the resonant system, with respect to the structure. In the higher frequency ranges, such as the very-high frequency range, it has been known to use resonant arrangements designated for instance as line resonators, strip lines, or the like. These resonant arrangements also permit the capacitive and inductive portions to be clearly distributed by giving specific geometric areas of the arrangement the capacitive or inductive property, respectively, of the resonant arrangement provided, however, that such areas must be clearly determined for different frequencies and geometrically definable. Finally it has been known in connection with super-high frequencies, for instance in the microwave range, to use cavity resonators as resonant systems. These cavity resonators distinguish themselves from the two structures described before in that there exists a fixed integral relation between the dimensions of the resonator and the employed wave length. In addition, it is no longer possible to obtain a clear distribution of the inductive and capacitive areas of the resonant system as the system may be excited in different modes, different modes of the first magnitude being possible in the same cavity resonator. In a cylindrical cavity resonator, for example, a $H_{011}$ or a $H_{111}$ oscillation may be excited independently of each other, and in addition higher magnitudes of the two modes are also possible. However, the capacitively or inductively active areas vary depending on the node of oscillation, the magnitude and the frequency employed.

It is a common problem in such investigations using magnetic resonance to give the measuring instruments used the highest possible sensitivity. The sensitivity achievable is proportional to the product of the quality of the resonant system used by the space factor, i.e. the portion of the volume included by the resonant system which is occupied by the test specimen to be investigated. However, the test specimen arranged within a resonant system cannot be increased in size at desire to increase the space factor because it would then get into the zones of the electric field lines (E) which would again lead to losses and, thus, to a loss in quality.

From an article by Froncisz and Hyde entitled "The Loop-Gap Resonator: A New Microwave Lumped Circuit ESR Sample Structure" published in the Journal of Magnetic Resonance, volume 47, pages 515 to 521 (1982) a resonant structure for carrying out electron spin resonance experiments has been known which is based on the before-described mechanism of the strip line. For, this known arrangement uses two barrel-type half shells separated by two narrow slots. The inductive portion of this structure is formed by the half shells while the capacitive portion is formed by the slots. However, it is a drawback of this known structure that the geometry of the half shells and the slots determine the resonance frequency of the structure so that highest demands must be placed upon the production of this structure. The slot widths used in such structures are considerably smaller than 1 mm which gives rise to problems not only as regards the exact positioning of the half shells, but also as regards the defined surface treatment of this arrangement, for instance by galvanizing. Considering that such components are usually galvanized in almost completely assembled state so as to obtain the best possible conditions for optimum reproducibility, it is not possible in practice to obtain perfect galvanization results in the gaps between the two half shells if the distance between the latter is considerably smaller than 1 mm. On the other hand, however, the geometry of the slot is of extraordinary importance as regards the developing resonance frequency.

Now, it is the object of the present invention to provide a resonant structure for generating magnetic dipole junctions in a test specimen which on the one hand offers a high product of quality by space factor, and on the other hand can be produced in a reproducible manner by the usual methods.

SUMMARY OF THE INVENTION

According to the present invention, this object is achieved in that the cavity resonator comprises electrically conductive means in such an arrangement that electric flux lines (E) are short-circuited at least over part of their length. So, contrary to the known arrangement described before, the element determining the basic frequency in the cavity resonator of the invention consists of a usual, for instance cylindrical, cavity resonator in which the electric flux lines are "shortened" to reduce its natural frequency. Such shortening of the electric flux lines, or reduction of the natural frequency of the cavity resonator leads on the other hand to a considerably higher space factor as the large-volume resonators normally required for low frequencies can now be considerably smaller in size so that an unchanged volume of the test specimen will result in a considerably higher space factor. This is a particular advantage in cases where only small quantities of the matter to be investigated are available so that if such small quantities were employed in combination with a large-volume resonator extremely unfavorable space factors would be obtained.

Considering that the conductive means used for shortening the electric flux lines provoke only a relative change of the natural frequency of the resonator, the exact positioning of such conductive means is not as critical in this arrangement as in the known arrangement in which the basic frequency is determined by the employed strip lines themselves.

A preferred improvement of the invention uses a cylindrical cavity resonator of the oscillation mode $H_{01n}$, wherein "n" is an integer. This known mode of oscillation exhibits a maximum of H lines and a minimum of E lines in the cylinder axis. So, this resonator arrangement is particularly suited for carrying out a great number of different experiments, for instance such in which the test specimen is simultaneously heated or exposed to rays of the most different types.

A particularly advantageous effect is obtained in this arrangement by the fact that shortening of the electric field lines is achieved by a toroidal structure in which electrically conductive and non-conductive areas are provided in alternate arrangement. So, the E flux lines can be shortened and the natural frequency of the resonator can be reduced at desire within a very broad range by a corresponding adjustment of the percentage of the conductive areas relative to the total circumference of the torus.

A particularly advantageous arrangement is achieved if the electrically non-conductive sectors of the torus are designed to give low dielectric losses, for instance made of quartz. This latter material is one which offers particularly low electric losses so that its presence in an area of high E line density can be regarded as uncritical.

In a further preferred improvement of the invention, the torus is formed in part by barrel-shaped conductive films separated by slots. The slots define the area of the remaining E lines as the conductive films carry only currents. So, the natural frequency of the resonator can be adjusted by corresponding adjustment of the slot widths.

A particularly advantageous effect can be achieved in this arrangement if the before-mentioned slots are covered up by additional barrel-shaped conductive films, because in this case the reduction of the natural frequency of the cavity resonator is no longer exclusively determined by the width of the slots in which non-homogeneous electric fields develop; rather, this arrangement creates additional areas between the conductive films in which homogeneous E lines develop so that the natural frequency can be varied in an easily reproducible manner by changing the width of the overlapping areas of the conductive films.

In a further improvement of the invention, the continuous barrel-shaped electrically conductive films are replaced by several sections extending in the axial direction of the cavity resonator, and the additional conductive films covering up the slots are preferably formed as one piece. As a result of this arrangement, the currents flow in the conductive films on the one hand in circular direction, i.e. in the neighboring areas, and on the other hand in the axial direction, i.e. via the additional, preferably one-piece conductive films. This physical distribution of the currents flowing in conductive films provides an additional means for varying the frequency in a reproducible manner.

If the non-conductive areas in the toroidal arrangement or arrangements are made of quartz glass, at least one of the said quartz sectors may, in a preferred improvement of the invention, be extended in length, for supporting the torus arrangement on an end face of the resonator.

Alternatively, it is of course also possible to arrange the sectors of the torus on a quartz tube which extends right to an end face of the cavity resonator.

If measurements are to be carried out on test specimens which are to be heated simultaneously, a particularly favorable effect is achieved if the said conductive films are provided on the inner and outer faces of a multi-walled Dewar of the type known in connection with measurements carried out by means of magnetic resonance and at varying ambient temperatures.

Other advantages of the invention will become apparent from the specification and the attached drawing which show and describe certain examples of embodiments of the invention.

DETAILED DESCRIPTION OF THE DRAWING

Figure 1:
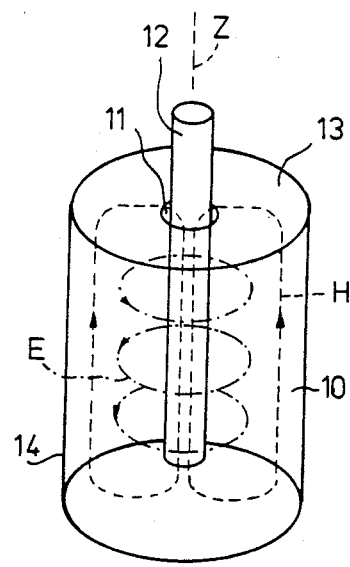
FIG. 1 shows a perspective view of a cylindrical cavity resonator of the $H_{011}$ mode, which is meant to illustrate the mechanism underlying the invention.

In FIG. 1, a cylindrical cavity resonator 10 can be seen which comprises an opening 11 for a test specimen 12. The opening 11 is arranged in an end face 13 of the resonator 10. The shell of the resonator 10 is designated by 14.

The cylindrical cavity resonator shown in FIG. 1 oscillates in the $H_{011}$ mode, which means that the magnetic flux lines (H) are axially directed along the cylinder axis Z and the shell 14, to close in the radial direction in the areas of the end faces 13. In contrast, the electric flux lines (E) extend circularly around the axis Z of the resonator 10. The density distribution of the E flux lines over the axis Z is approximately sinoidal which means that the electric field strength is equal to 0 in the area of the end faces 13, and reaches its maximum at half the height of the resonator.

Consequently, the test specimen 12 is located in area where the H flux lines reaches their maximum, but where the electric field strengths are relatively low.

Figure 2:
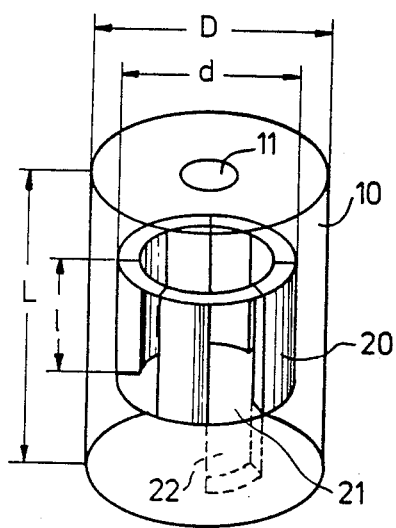
FIG. 2 shows a first embodiment of a cavity resonator in accordance with the invention, with a torus structure using alternate conductive and non-conductive areas.

In the first example shown in FIG. 2, a toroidal arrangement of barrel shape is arranged within the resonator 10. The said arrangement is subdivided into conductive sectors 20 and non-conductive sectors, for instance quartz sectors, 21. In the example shown in FIG. 2, four conductive sectors 20 and four quartz sectors 21, all of equal width, are provided. One of the said quartz sectors 21 is extended in length right to an end face 13 of the resonator 10, for mounting the torus on the said end face.

However, it goes without saying that this type of mounting has been described by way of example only and that other means, for instance several such extensions or a common quartz tube, may serve the same purpose.

By the arrangement shown in FIG. 2, the E lines are short-circuited in the areas of the conductive sectors 20 so that they can propagate only in the quartz sectors 21 in the manner indicated in FIG. 1. As a result, the E lines are shortened by half their length in the example shown in FIG. 2. This reduction in length of the E lines in an area of high intensity results in a reduction of the natural frequency of the cavity resonator 10. Thus, a reduction in size of the resonator by a factor of, for example, 5 or 10 can be achieved as compared with the usual resonator without such an arrangement, which in turn increases the space factor correspondingly without any change of the volume of the test specimen 12.

In the example shown in FIG. 2, D designates the diameter of the resonator 10 while d designates the diameter of the toroidal arrangement. The overall length of the cavity resonator 10 is designated by L, that of the torus by 1. In a typical test setup, the following approximate dimensions were used.

D=20 to 40 mm
d=5 to 15 mm
L=20 to 40 mm
l=5 to 10 mm

These dimensions are, however, to be understood as examples only which relate only to specific frequency ranges. They are merely meant to illustrate the relationship between the dimensions as they exist in certain test setups and do not in any way restrict the scope and importance of the present invention.

Figure 3A:
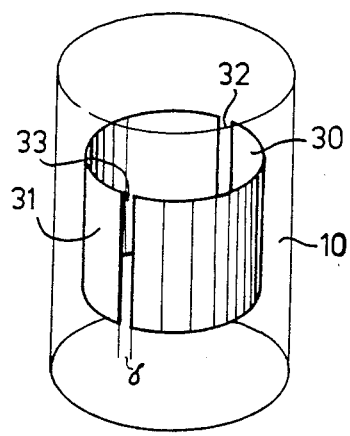
FIGS. 3a and b show a second embodiment of a cavity resonator in accordance with the invention, with two barrel-shaped conductive films, and an enlarged view illustrating the underlying mechanism.

In the second example shown in FIGS. 3a and b, the toroidal arrangement for shortening the E flux lines comprises two conductive films 30, 31 separated by slots 32, 33. The conductive films 30, 31 have the shape of half a cylinder shell. The width of the slots 32, 33 is designated by $\delta$. As related to the dimensions given above by way of example, $\delta$ may be equal to 1 mm.

In the example shown in FIG. 3, two conductive films 30, 31 with two slots 32, 33 are used only, but it is of course also possible to use more film sectors with a correspondingly higher number of slots, or else only one film which is then almost fully closed, except for a single slot.

Figure 3B:
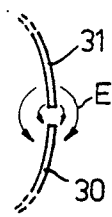

FIG. 3b illustrates the E flux lines encountered in one of the slots 32, 33. Due to the finite thickness of the conductive films 30, 31 and the before-mentioned width $\delta$, inhomogenous E flux lines, for instance in the form indicated in the drawing, are obtained. If extremely high demands are placed on the reproducibility of this section, this may give rise to problems as any variations of the geometry of the slot will lead to variations in the inhomogenous E field and, thus, to variations in the reduction of the frequency because the reduction in length of the E lines is no longer clearly defined.

Figure 4:
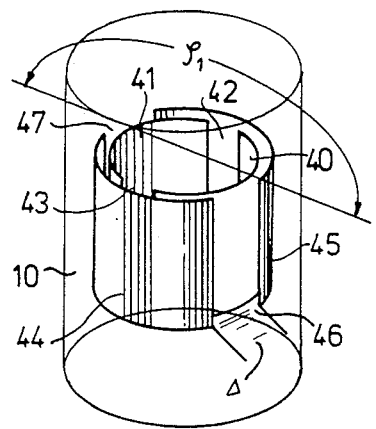
FIG. 4 shows a third embodiment of a cavity resonator in accordance with the invention, with two coaxially arranged barrel-shaped conductive films.

The third example shown in FIG. 4 eliminates this disadvantage which may possibly be encountered in extreme cases, by using a structure comprising two pairs of conductive films provided in coaxial arrangement. The inner two conductive films 40, 41 are separated by gaps 42, 43 and enclosed by another pair of conductive films 44, 45 which is again separated by gaps 46, 47. As can be seen in FIG. 4, the gaps 42, 43, 46, 47 are considerably wider than the gaps 32, 33 in FIG. 3, the width $\Delta$ of the gaps used in FIG. 4 being for instance, $\Delta=3$ mm or above.

The reduction in length of the electric flux lines is achieved in the example shown in FIG. 4 mainly by the films 40, 41, while the films 44, 45 serve substantially to cover up the gaps 42, 43. This is possible because the gaps 46, 47 are set off by 90° relative to the gaps 42, 43 so that the gaps 42, 43 are overlapped over an angle $\phi_1$ of almost 180°.

Figure 5A:
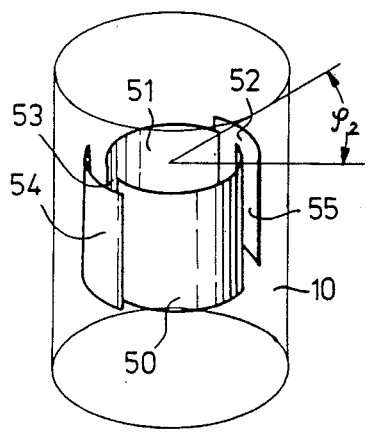
FIGS. 5a and b show a fourth embodiment of a cavity resonator in accordance with the invention, with two coaxially arranged pairs of conductive films provided likewise in coaxial arrangement, but exhibiting different lengths, and an enlarged partial view illustrating the underlying mechanism.
Figure 5B:
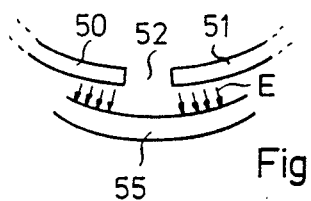

The example shown in FIG. 5a, 5b, although using basically the same structure with inner films 50, 51 separated by gaps 52, 53 and outer films 54, 55, differs from the example shown in FIG. 4 in that the gaps 52, 53 are overlapped by the films 54, 55 only over a smaller angle $\phi_2$.

The effects achieved by the structure shown in FIG. 5a are illustrated in FIG. 5b. As can be seen, the overlapping portions of the film 55 and the inner films 50, 51 form between them spaces 52, in which homogenous E lines develop, contrary to the example shown in FIG. 3 where an inhomogenous propagation of the E flux lines was encountered. So, the effective reduction in length of the E flux lines can be adjusted very efficiently and in a reproducible manner by varying the angle by which the outer films overlap the gaps between the inner films, i.e. the angles $\phi_1$ and $\phi_2$ in FIGS. 4 and 5. For, any tolerances in the overlapping width are much less critical as regards the natural frequency of the cavity resonator 10 than any tolerances in the gap width $\delta$ according to FIG. 3.

Figure 6:
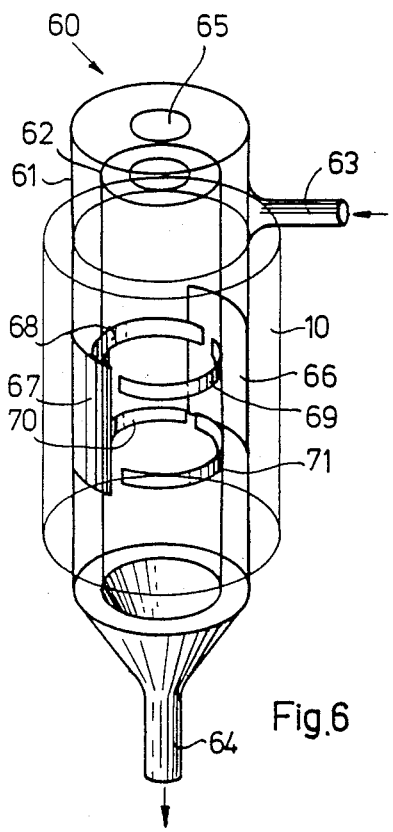
FIG. 6 shows a fifth embodiment of a cavity resonator in accordance with the invention, in which the conductive means are applied to a Dewar.

The fifth example shown in FIG. 6 illustrates on the one hand a manner of fastening the conductive films and, on the other hand, another structure of the conductive films.

In FIG. 6, the cavity resonator 10 is provided with a conventional Dewar 60 extending in the axial direction through the cavity resonator 10. The Dewar 60 is of the double-walled type, the outer wall 61 and the inner wall 62 being indicated in the drawing. The heating agent, for instance gaseous nitrogen which is supplied via an inlet 63 and discharged by an outlet 64, flows through the space between the outer wall 61 and the inner wall 62. An opening 65 which is closed about the lateral surface area passes through the outer wall 61 and inner wall 62 and serves to introduce a test specimen 12. The outer wall 61 of the Dewar 60 is provided with a pair of conductive films 66, 67 corresponding in shape and function to the conductive films 54, 55 of FIG. 5. In contrast, the inner wall 62 is provided with two axially spaced pairs of conductive films, i.e. one pair 68, 69 and, at a certain distance therefrom, another pair 70, 71. The pairs 68, 69 and 70, 71 are of strip-like shape, corresponding to half the shell of a very flat cylinder. The reduction in length of the E flux lines is effected by the said pairs 68, 69 and 70, 71 in the respective areas. The characteristic feature of the structure according to FIG. 6 is to be seen in the fact that the currents flowing in the films flow in the area of the films 68, 69 and 70, 71 along circular lines, but are also capable of flowing from the latter via the outer films 66, 67 in axial direction so that a propagation of the said currents occurs in the axial direction and vertically thereto. This "diversion" of the currents in the said films provides an additional possibility of adjustment for the reduction of the natural frequency as it varies the effective reduction in length of the E lines.

The outer wall 61 and the inner wall 62 of the Dewar 60 shown in FIG. 6 are of course of finite thickness so that the conductive films 66 to 71 may also be arranged on the inner and outer faces, respectively, of one of these walls.

We claim:

1. A microwave resonator for generating magnetic dipole transitions in a sample of material under investigation, said resonator comprising:
   a microwave cavity resonator formed from electrically conductive material and defined by end faces and lateral walls the physical dimensions of which determine the natural resonant frequency of the cavity resonator at a given microwave resonant mode, said end faces extending in a perpendicular direction to a first coordinate z and said lateral walls extending in a parallel direction thereto;
   a sample tube containing said sample and being arranged along said coordinate z and further extending through an aperture in one of said end faces;
   coupling means for coupling microwave energy into said cavity resonator to establish a mode of operation, determined by said microwave resonant mode, in which magnetic flux lines are concentrated along said sample and electric flux lines extending therearound; and
   electrically conductive means arranged within said cavity resonator, said electrically conductive means having conductive paths along said electric flux lines and being effective to reduce the natural frequency of said cavity resonator leading to a high filling factor whereby large volume cavity resonators normally required at low frequencies can be made smaller in size.

2. A microwave resonator for generating magnetic dipole transitions in a sample of material under investigation, said resonator comprising:
   a cavity formed from electrically conductive material and having end faces and lateral walls, said end faces extending in a perpendicular direction to a first coordinate z and said lateral walls extending in a parallel direction thereto;
   a sample tube containing said sample and being arranged along said coordinate z and further extending through an aperture in one of said end faces;
   coupling means for coupling microwave energy into said cavity to establish a mode of oscillation in which magnetic flux lines are concentrated along said sample and electric flux lines extending therearound; and
   electrically conductive means arranged within said cavity, said electrically conductive means having conductive paths along said electric flux lines, said electrically conductive means being barrel shaped and arranged coaxially to said conductor z, said electrically conductive means being subdivided into conductive and non-conductive sectors, the non-conductive sectors being made of non-conductive material with low dielectric losses.

3. The microwave resonator as recited in claim 2, wherein said cavity is of cylindrical shape and being excited by an oscillation mode $H_{01n}$, wherein n is an integer.

4. The microwave resonator as recited in claim 3, wherein said electrically conductive means are shaped in the form of sectors of a torus and arranged coaxially relative to said coordinate z.

5. The microwave resonator as recited in claim 4, wherein said sectors are subdivided into portions, said portions being arranged in parallel next to each other along the direction of said coordinate z.

6. The microwave resonator as recited in claim 4, wherein said sectors are arranged on a coaxial tube, said tube being made of a non-conductive material with low dielectric losses, and extending in perpendicular direction to said end faces of said cavity.

7. The microwave resonator as recited in claim 6, wherein said tube forms part of a dewar for heating said sample.

8. The microwave resonator as recited in claim 3, wherein the ratio of the radius of said cylindrical shaped cavity, to the radius of said barrel shaped electrically conductive means, is not less than 1.3 nor greater than 8.0.

9. A microwave resonator for generating magnetic dipole transitions in a sample of material under investigation, said resonator comprising:
   a cavity formed from electrically conductive material and having end faces and lateral walls, said end faces extending in a perpendicular direction to a first coordinate z and said lateral walls extending in a parallel direction thereto;
   a sample tube containing said sample and being arranged along said coordinate z and further extending through an aperture in one of said end faces;
   coupling means for coupling microwave energy into said cavity to establish a mode of oscillation in which magnetic flux lines are concentrated along said sample and electric flux lines extending therearound; and
   electrically conductive means arranged within said cavity, said electrically conductive means having conductive paths along said electric flux lines, said electrically conductive means being of barrel shape in form of sectors of a torus and arranged coaxially to said coordinate z, said electrically conductive means comprising a first conductive film with at least one actual gap, said actual gap and an adjacent area of said first conductive film being overlapped by a second conductive film.

10. The microwave resonator as recited in claim 9, wherein said first conductive film is arranged on an inner wall of a dewar and said second conductive film is arranged on an outer wall of said dewar.

11. A microwave resonator for generating magnetic dipole transitions in a sample of material under investigation, said resonator comprising:
   a cavity formed from electrically conductive material and having end faces and lateral walls, said end faces extending in a perpendicular direction to a first coordinate z and said lateral walls extending in a parallel direction thereto;
   a sample tube containing said sample and being arranged along said coordinate z and further extending through an aperture in one of said end faces;
   coupling means for coupling microwave energy into said cavity to establish a mode of oscillation in which magnetic flux lines are concentrated along said sample and electric flux lines extending therearound; and
   electrically conductive means arranged within said cavity, said electrically conductive means having conductive paths along said electric flux lines, said electrically conductive means being barrel shaped and arranged coaxially to said coordinate z, said electrically conductive means being subdivided into conductive and non-conductive sectors, at least one of said non-conductive sectors being extended longitudinally towards one of said end faces of said cavity.

* * * * *